United States Patent [19]

Todokoro et al.

[11] Patent Number: 4,922,097
[45] Date of Patent: May 1, 1990

[54] POTENTIAL MEASUREMENT DEVICE

[75] Inventors: Hideo Todokoro, Tokyo; Hiroyuki Shinada, Chofu; Shigemitsu Seitoh, Hachioji, all of Japan

[73] Assignee: Hitachi, Ltd., Tokyo, Japan

[21] Appl. No.: 232,655

[22] Filed: Aug. 16, 1988

[30] Foreign Application Priority Data

Aug. 24, 1987 [JP] Japan .............................. 62-208116

[51] Int. Cl.$^5$ .............................................. H01J 37/26
[52] U.S. Cl. .................................... 250/310; 250/397
[58] Field of Search ............... 250/310, 396, 397, 305

[56] References Cited

U.S. PATENT DOCUMENTS

| | | | |
|---|---|---|---|
| 4,658,136 | 4/1987 | Ohtaka et al. | 250/310 |
| 4,714,833 | 12/1987 | Rose et al. | 250/397 |
| 4,779,046 | 10/1988 | Rouberoi et al. | 250/310 |
| 4,798,953 | 1/1989 | de Chanbost | 250/310 |
| 4,812,651 | 3/1989 | Feuerbaum et al. | 250/310 |

FOREIGN PATENT DOCUMENTS 47-51024 12/1972 Japan .

Primary Examiner—Bruce C. Anderson
Attorney, Agent, or Firm—Antonelli, Terry & Wands

[57] ABSTRACT

A potential measurement device including an irradiator for irradiating a sample with an electron beam; an extracting electrode disposed above the sample and extracting secondary electrons emitted from the part irradiated with the electron beam; a hemi-spherical grid analyzing the energy of the extracted secondary electrons; a lens disposed between the hemispherical grid and the sample and focusing both the electron beam and the secondary electrons; and a deflector disposed on the grid side with respect to the lens and producing electric and magnetic fields crossing perpendicularly to each other, which don't deflect the electron beam, but deflect only the secondary electrons.

8 Claims, 3 Drawing Sheets

POTENTIAL MEASUREMENT DEVICE

BACKGROUND OF THE INVENTION

This invention relates to a potential measurement device for measuring potential while irradiating a sample with an electron beam and in particular to a potential measurement device for measuring variations in potential with respect to time (potential waveform) at a fine place (for example, circuit node) in an LSI by using a scanning electron microscope.

It is known that it is possible to measure the potential at a place irradiated with an electron beam by adding a device for analyzing the energy of secondary electrons to a scanning electron microscope (JP-B-47-51024).

FIG. 2A shows this principle. A control grid 5 is disposed between a sample 1 to be tested and a secondary electron detector 4 mounted opposite thereto. This control grid 5 forms a potential barrier for discriminating energies of secondary electrons 3 emitted by irradiation of the sample with an electron beam 2. FIG. 2B is a scheme for explaining the function of this potential barrier. In the case where there were disposed no control grid 5 above the sample, all the secondary electrons would be detected by the secondary electron detector 4. Energies of the secondary electrons emitted by the sample 1 at the earth potential are distributed as indicated by A in FIG. 2B. When the potential of the sample 1 is $-5$ V, the energy distribution is indicated by B. When the control grid 5 is disposed and a voltage of $-5$ V is applied thereto, detected secondary electrons are restricted to those having energies higher than 5 eV. Therefore the output of the secondary electron detector varies, depending on the potential of the sample. Since the output depends on the potential of the sample in this way, it is possible to know the potential of the sample 1 by using the output of the secondary electron detector contrariwise.

FIG. 3 illustrates the construction of a prior art voltage measurement device. In this example a hemi-spherical control grid 5 is disposed above an objective lens 6 composed of a magnetic path 12 and a coil 11. The electron beam 2 is focused by the objective lens 6 and the sample 1 is irradiated therewith. Secondary electrons 3 are attracted and accelerated upward by a positive potential supplied to an extraction grid 7 by a positive voltage source 8. Accelerated secondary electrons are subjected to the focusing action of the objective lens 6. They are collected to a focal point and diverged again after having passed therethrough, as indicated in FIG. 3. Then their energies are analyzed by the control grid 5 by a normally negative voltage source 18. The center of the sphere constituting the control grid 5 and the focal point of the secondary electrons are in agreement with each other so that the diverged secondary electrons are projected perpendicularly to the control grid 5. This adjustment is effected by varying the potential supplied to the extraction grid 7 by the positive voltage source 8. The potential measurement device of this structure has a feature that the focal length of the objective lens 6 is short. However, when the trajectory of the secondary electrons was analyzed, it was found that the diameter of the secondary electron beam is only 3-4 mm, when it has reached the control grid 5. In the control grid 5 there is formed an aperture 13, through which the irradiation electron beam passes. The size of the aperture is about 2 mm$\phi$ and it was found that this is too great with respect to the spread of the secondary electron beam. In the neighborhood of the aperture, since the electric field is disordered, secondary electrons are projected to the control grid 5 not perpendicularly, which gives rise to measurement errors. In addition the detection efficiency is lowered, because the electrons entering the aperture 13 are not detected. However, from the constructional point of view, it is difficult to reduce further the size of the aperture 13. This is because shield grids 9 should be disposed before and behind the control grid 5 and in addition a cylinder 10 should be introduced in the aperture 13, as indicated in FIG. 3. A constant positive potential is given to these shield grids 9 and the cylinder 10 by a voltage source 24 so that it is prevented that the electron beam 2 is deflected by variations in potential at the control grid 5.

Secondary electrons 3, which have overcome the potential barrier formed by the control grid 5, are detected by secondary electron detectors, each of which consists of a scintillator 14, a light guide 15 and a photomultiplier 16. The positive potential by voltage sources 17 plays the role of attracting secondary electrons to the scintillator 14. In FIG. 3 the portion generating the electron beam 2, scanning coils, etc. are omitted.

SUMMARY OF THE INVENTION

The object of this invention is to provide a potential measurement device, by means of which these measurement errors due to the aperture and lowering in detection efficiency are prevented and potential measurement is effected with a high precision and a high efficiency.

The above object can be achieved by shifting the trajectory of the secondary electrons from the aperture. However, if the primary electron beam were deflected, a problem would be produced that the electron beam cannot be focused to a fine beam.

Therefore, according to this invention, a deflector, which doesn't defect the primary electron beam, but deflects only the secondary electron beam, is adopted. Combining an electric field and a magnetic field so as to balance them with respect to the primary electron beam, the deflector can deflect only the secondary electrons without deflecting the primary electron beam.

Now the operation of this invention will be explained, referring to FIG. 4. In FIG. 4, the electric field and the magnetic field are perpendicular to each other. When voltages of $\pm V_p$ are applied to two deflecting plates having a length Z and disposed with an interval g, the primary electron beam (energy: $eV_1$) is deflected by:

$$\theta_S = \tan^{-1}(z \cdot V_p / V_1 / g).$$

On the other hand the deflection angle due to the magnetic field B can be given by:

$$\theta_B \tan^{-1}(k \cdot V_1^{-\frac{1}{2}} \cdot B \cdot z)$$

$$k = (e/m/2)^{\frac{1}{2}},$$

where m represents the electron mass. Since the deflection thereof produced by the electric field and that produced by the magnetic field are opposite to each other, if $\theta_S = \theta_B$, the primary electron beam is not deflected. The condition therefor is given by:

$$V_p/B = k \cdot g \cdot V_1^{\frac{1}{2}}$$

Since the secondary and primary electrons fly in directions opposite to each other, the direction of the deflection for the formers is inverted to that for the latters. Therefore the formers are never balanced, but they are deflected strongly by an angle, which is the sum of the two deflections. The acceleration energy of the secondary electrons being $eV_2$, the deflection angle $\theta$ thereof is given by;

$$\theta_2 = \tan^{-1}(z/V_2 \cdot V_p/g)$$
$$+ \tan^{-1}(k \cdot V_2^{-\frac{1}{2}} \cdot B \cdot z).$$

DESCRIPTION OF THE PREFERRED EMBODIMENTS

Figure 1:
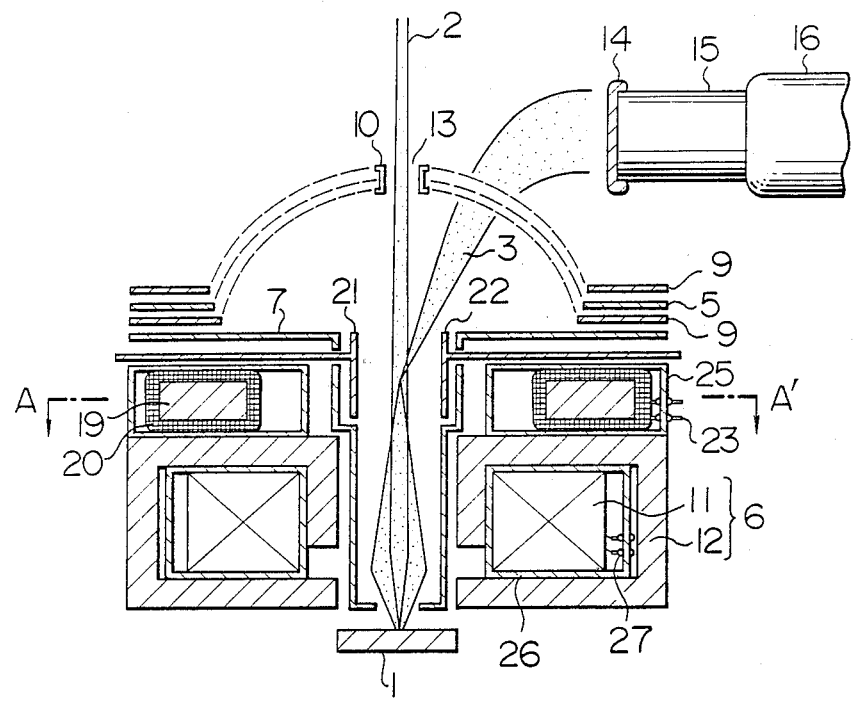
FIG. 1 is a scheme illustrating the construction of an embodiment of this invention.
Figure 2A:
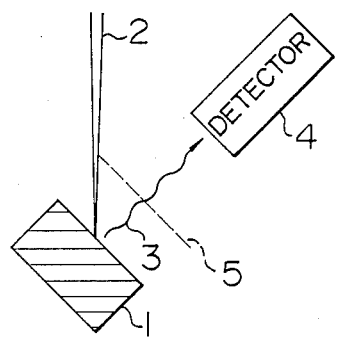
FIG. 2A is a scheme for explaining the principle of the potential measurement by using an electron beam.
Figure 2B:
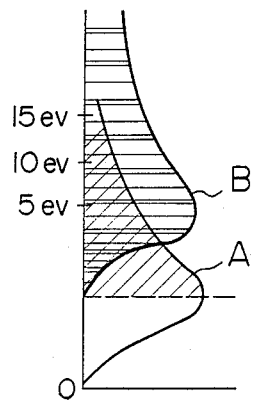
FIG. 2B shows the energy distribution of secondary electrons.
Figure 3:
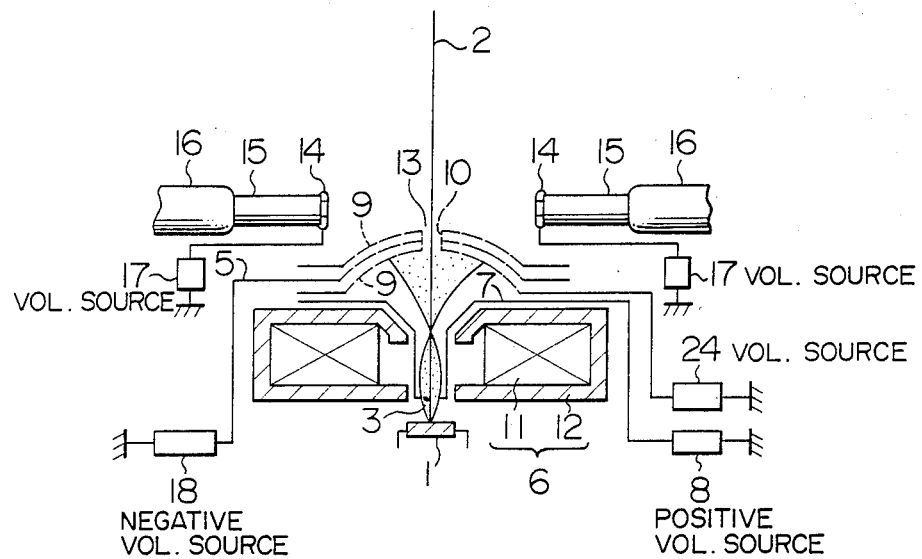
FIG. 3 is a scheme for explaining a prior art voltage measurement device.
Figure 4:
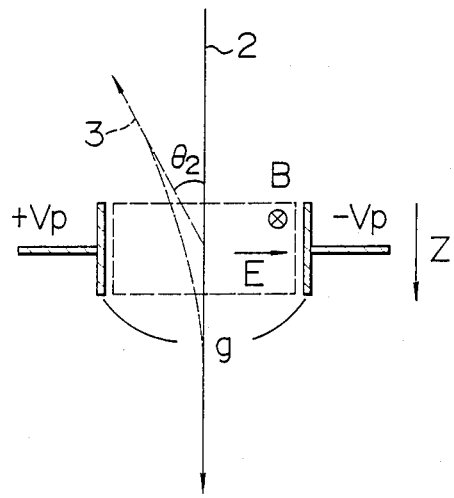
FIG. 4 is a scheme for explaining the principle of a deflector used for realizing this invention.
Figure 5:
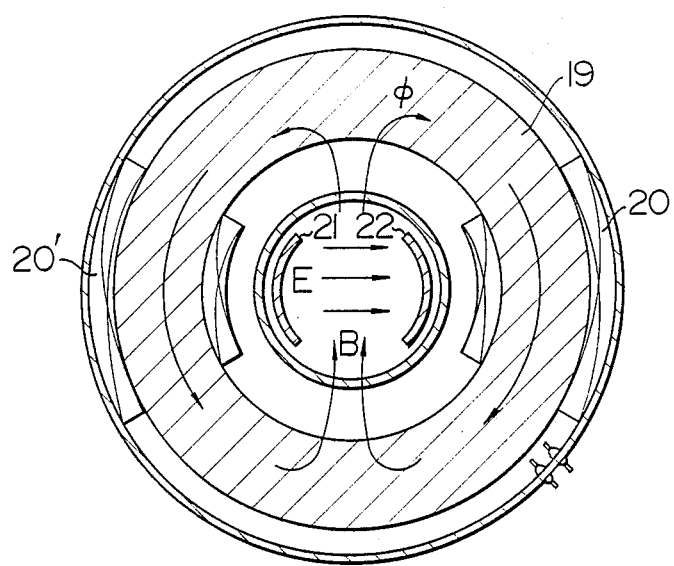
FIG. 5 is a cross-sectional view along the line A—A' in FIG. 1 for explaining the deflecting portion in the embodiment of this invention more in detail.

FIG. 1 shows an embodiment of this invention. In this embodiment an electromagnetic coil 20 generating a magnetic field and deflecting plates 21 and 22 generating an electric field are disposed above the objective lens 6. These electric and magnetic fields are balanced so that the primary electron beam 2 is not influenced by them, but secondary electrons 3 are subjected to the deflecting action thereof. The electromagnetic coil 20 and the magnetic path 19 are sealed in a deflecting case 25 so that the atmospheric pressure is held within the deflecting case 25, when the path of the electrons is evacuated, in order to avoid that vacuum is worsened because of outgas from the coil 20. The lead lines of the coil 20 are taken out from the deflecting case 25 through feedthroughs 23. A coil 11 of the objective lens 6 is sealed in an objective lens case 26 in a similar manner and the lead lines thereof are taken out from the case 26 through feedthrough 27. Power sources for driving the coils 11, 20 and the deflecting plate 22 are not indicated in the figure. The other construction is identical to the prior art example indicated in FIG. 3. FIG. 5 is a scheme of this part in the cross-section (A—A'). The coils 20 and 20' are wound around the magnetic path 19 and magnetic flux $\phi$ passes as indicated by arrows, which produces magnetic field B at the central portion. On the other hand a voltage is given to the deflecting plates 21 and 22, which produces electric field E. The magnetic field B and the electric field E are so regulated that the forces imparted to primary electrons by them are balanced and therefore the primary electrons are not deflected. Although the electromagnetic coil is divided into two, left and right, 20 and 20', in this embodiment, it is also conceivable that each of the two partial coils 20 and 20' is further divided into two parts, up and down (in FIG. 5), and that the ratio of currents passing through four partial coils is varied so as to improve the orthogonality of the magnetic field B and the electric field E.

Figure 6:
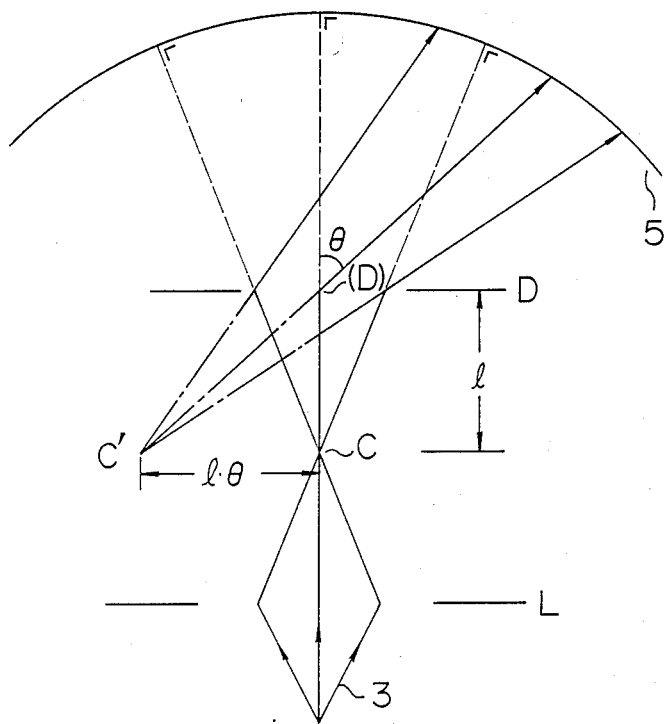
FIG. 6 is a scheme for explaining the advantage obtained by the fact that the deflection pivot and the centers of the sphere constituting the control grid.

FIG. 6 shows the aspect of deflection of secondary electrons more in detail. The secondary electrons 3 emitted by a sample are focused by the lens portion L, pass through a point C and are diverged. After that, they are deflected by the deflecting portion D. As the result of this deflection it can be thought that the point of divergence C of the secondary electrons is shifted to another point C' by $l \cdot \theta$. In general the center of the sphere constituting the control grid 5 and the point C are located so as to be in agreement with each other so that the secondary electrons are projected perpendicularly to the grid 5. However, in the case where the deflection angle $\theta$ is great, since the incident angle of the secondary electrons to the grid 5 is no more perpendicular, measurement errors increase. A method for preventing this consists in that the control grid is so located that the center thereof is at the new point C', to which the divergence point is shifted by the deflection. However this method has a disadvantage that, since the focusing point of the secondary electrons is fixed, regulation is difficult. In order that the secondary electrons are projected always perpendicularly to the grid, independently of the deflection angle, it may be sufficient that the center of the sphere constituting the control grid 5 and the deflection pivot (D) are in agreement with each other and further the deflection pivot (D) and the focusing point C are in agreement with each other. Since $l=0$, C and C' are always in agreement. As described previously, it is easy to adjust the focusing point by regulating the potential supplied to the extracting electrode 7 by the positive voltage source 8 or by regulating the current intensity flowing through the coils in the lens.

According to this invention, it becomes possible to eliminate measurement errors, which were produced heretofore at the aperture part for making the electron beam (primary electrons) pass through, and to increase the measurement precision of the voltage measurement device using an electron beam. In particular, in a device, in which the deflection pivot and the center of the spherical control grid are in agreement with each other, the effect become further remarkable.

We claim:

1. A potential measurement device comprising:
   means for irradiating a sample with an electron beam;
   an extracting electrode disposed above said sample and extracting secondary electrons emitted by irradiation of said sample with said electron beam;
   a hemi-spherical grid analyzing the energy of said extracted secondary electrons; grid and said sample and focusing both said electron beam and said secondary electrons;
   a deflector disposed between said lens and said hemi-spherical grid and producing electric and magnetic fields crossing perpendicularly to each other, which don't deflect said electron beam, but deflect only said secondary electrons; and
   means for detecting said secondary electrons having passed through said grid.

2. A potential measurement device according to claim 1, wherein said deflector and said hemi-spherical grid are so positioned that the deflection pivot of the former and the center of the sphere constituting said hemi-spherical grid are in agreement with each other.

3. A potential measurement device according to claim 2, further comprising regulating means for regulating the position of the focusing point, to which said secondary electrons are focused by said lens so that said focusing point and the center of the sphere constituting said hemi-spherical grid are in agreement with each other.

4. A potential measurement device according to claim 3, wherein said regulating means includes means for regulating a voltage applied to said extracting electrode.

5. A potential measurement device according to claim 1, wherein said deflector consists of deflecting plates and magnetic field generating means and is so constructed that the following condition is fulfilled;

$$Vp/B = k \cdot g \cdot V_1^{\frac{1}{2}}$$

where
$k = (e/m/2)^{\frac{1}{2}}$

Vp: voltage applied to the deflecting plates,
B: magnetic field in the deflector,
g: interval between the deflecting plates,
$eV_1$: energy of an electron in the electron beam
and m: electron mass.

6. A potential measurement device according to claim 1, wherein said deflector consists of a ring-shaped magnetic path member, coil means, generating magnetic flux having opposite directions in said ring-shaped magnetic path member and deflecting plates disposed in said ring-shaped magnetic path member so as to be opposite to each other.

7. A potential measuring device comprising:
   means for radiating a sample with an electron beam;
   an extracting electrode disposed above said sample for extracting secondary electrons emitted by irradiation of said sample with said electron beam;
   hemi-spherical grid means for analyzing the energy of said extracted secondary electrons;
   lens means disposed between said hemi-spherical grid means and said sample for focusing both said electron beam and said secondary electrons;
   deflector means disposed between said lens means and said hemi-spherical grid means for producing electric and magnetic fields crossing perpendicularly to each other so as to only deflect substantially all of said extracted secondary electrons to said hemi-spherical grid means without deflecting said electron beam; and
   means for detecting said secondary electrons having passed through said hemi-spherical grid means.

8. A potential measurement device according to claim 7, wherein said hemi-spherical grid means is disposed above said extracting electrode and said deflector means is disposed between said extracting electrode and said lens means.

* * * * *